United States Patent
Harada et al.

(10) Patent No.: US 11,749,553 B2
(45) Date of Patent: Sep. 5, 2023

(54) VACUUM ROBOT, VACUUM MOTOR, AND VACUUM MOTOR ENCODER

(71) Applicant: KABUSHIKI KAISHA YASKAWA DENKI, Fukuoka (JP)

(72) Inventors: Masanobu Harada, Fukuoka (JP); Hiromitsu Akae, Fukuoka (JP); Norihisa Iwasaki, Fukuoka (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 353 days.

(21) Appl. No.: 17/090,922

(22) Filed: Nov. 6, 2020

(65) Prior Publication Data

US 2021/0151343 A1 May 20, 2021

(30) Foreign Application Priority Data

Nov. 14, 2019 (JP) ................. 2019-206489

(51) Int. Cl.
*B25J 19/02* (2006.01)
*H01L 21/687* (2006.01)
*H01L 21/67* (2006.01)
*B65G 47/90* (2006.01)
*H02K 7/08* (2006.01)
*H02K 11/215* (2016.01)
*H02K 5/173* (2006.01)

(52) U.S. Cl.
CPC ...... *H01L 21/68707* (2013.01); *B25J 19/027* (2013.01); *B65G 47/90* (2013.01); *H01L 21/67167* (2013.01); *H02K 5/1737* (2013.01); *H02K 7/088* (2013.01); *H02K 11/215* (2016.01)

(58) Field of Classification Search
CPC .. H01L 21/68707; H02K 11/215; B25J 19/02; B25J 19/027
See application file for complete search history.

(56) References Cited

FOREIGN PATENT DOCUMENTS

| JP | 3726978 B2 | 12/2005 |
| JP | 3740770 B2 | 2/2006 |
| JP | 3812807 B2 | 8/2006 |
| JP | 4046303 B2 | 2/2008 |
| JP | 2012-231652 A | 11/2012 |
| JP | 2012-253846 A | 12/2012 |

(Continued)

OTHER PUBLICATIONS

An Office Action dated Nov. 25, 2021, issued from the Korean Intellectual Property Office (KIPO) of Korean Patent Application No. 10-2020-0143552 and a Partial English translation thereof (23 pages).

(Continued)

*Primary Examiner* — Ramon M Barrera
(74) *Attorney, Agent, or Firm* — Venjuris, P.C.

(57) ABSTRACT

A first vacuum motor includes a first pivoting shaft member, a bearing that rotatably supports the first pivoting shaft member, a disk disposed to be rotatable together with the first pivoting shaft member and having slits, a first bracket that is made of a non-magnetic material and supports the bearing, a recess formed in the first bracket to be dented in the axial direction, and a sensor unit disposed to face the disk in the axial direction via a thin wall formed by the recess. By the thin wall, the space where the sensor unit is disposed under the atmospheric pressure is isolated from the space where the disk is disposed under a reduced pressure lower than the atmospheric pressure.

18 Claims, 9 Drawing Sheets

(56) References Cited

FOREIGN PATENT DOCUMENTS

| | | |
|---|---|---|
| JP | 2013-027097 A | 2/2013 |
| JP | 5738059 B2 | 6/2015 |
| KR | 10-2009-0017452 A | 2/2009 |
| WO | 2019/065505 A1 | 4/2019 |

OTHER PUBLICATIONS

Korean Office Aciton of Korean counterpart of this application dated Jun. 9, 2023 and English translation thereof (15 pages).

VACUUM ROBOT, VACUUM MOTOR, AND VACUUM MOTOR ENCODER

CROSS-REFERENCE TO RELATED APPLICATIONS

This application is based on and claims priority from Japanese Patent Application No. 2019-206489 filed on Nov. 14, 2019 with the Japan Patent Office, the disclosure of which is incorporated herein in its entirety by reference.

TECHNICAL FIELD

The present disclosure relates to a vacuum robot, a vacuum motor, and a vacuum motor encoder.

BACKGROUND

Japanese Patent Laid-Open Publication No. 2012-231652 discloses a vacuum robot provided with a vacuum motor. The vacuum motor includes a rotary disk having a surface on which codes for generating signals are arranged, a sensor disposed to face the surface of the rotary disk and capable of detecting signals, a sensor chamber that accommodates the sensor therein and has an opening at a portion facing the sensor, and a transmission window provided to close the opening of the sensor chamber and configured to transmit signals. The internal space of the sensor chamber is separated from the space where the rotary disk is disposed.

SUMMARY

According to an aspect of the present disclosure, a vacuum robot includes a vacuum motor, and an arm driven by the vacuum motor. The vacuum motor includes a shaft that extends in an axial direction, a bearing configured to rotatably support the shaft, a disk disposed to be rotatable together with the shaft and having slits, a bearing support member formed of a non-magnetic material and provided with a recess that supports the bearing wherein the recess is formed in the bearing support member to be dented in the axial direction, and a magnetic sensor disposed to face the disk in the axial direction via a thin wall of the bearing support member that is formed by the recess. The thin wall isolates a space where the magnetic sensor is disposed under an atmospheric pressure from a space where the disk is disposed under a reduced pressure lower than the atmospheric pressure.

According to another aspect of the present disclosure, a vacuum motor includes: a shaft that extends in an axial direction; a bearing configured to rotatably support the shaft; a disk disposed to be rotatable together with the shaft and having slits; a bearing support member formed of a non-magnetic material and provided with a recess that supports the bearing wherein the recess is formed in the bearing support member to be dented in the axial direction; and a magnetic sensor disposed to face the disk in the axial direction via a thin wall of the bearing support member that is formed by the recess, and configured to detect the slits. The thin wall isolates a space where the magnetic sensor is disposed under an atmospheric pressure from a space where the disk is disposed under a reduced pressure lower than the atmospheric pressure.

According to yet another aspect of the present disclosure, a vacuum motor encoder includes: a disk disposed to be rotatable together with a shaft that extends in an axial direction and is rotatably supported by a bearing, and having slits; and a magnetic sensor disposed to face the disk in the axial direction via a thin wall formed by a recess formed to be dented in the axial direction in a bearing support member formed of a non-magnetic material and configured to support the bearing, and configured to detect the slits. The thin wall isolates a space where the magnetic sensor is disposed under an atmospheric pressure from a space where the disk is disposed under a reduced pressure lower than the atmospheric pressure.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings which form a part of the specification. The illustrative embodiments described in the detailed description, drawings, and claims are not meant to be limiting. Other embodiments may be utilized, and other changes may be made without departing from the spirit or scope of the subject matter presented herein.

In the structure of the related art described above, a sealing process is generally performed using a sealing material between the opening of the sensor chamber and the transmission window. However, when the sealing material is heated, an impurity gas may be discharged into the space where the rotary disk is disposed which is problematic.

An embodiment of the present disclosure has been made in consideration of the problem, and provides a vacuum robot, a vacuum motor, and a vacuum motor encoder which are capable of reducing the generation of impurity gas.

Hereinafter, embodiments of the present disclosure will be described with reference to the accompanying drawings.

1. Configuration of Robot System

Figure 1:
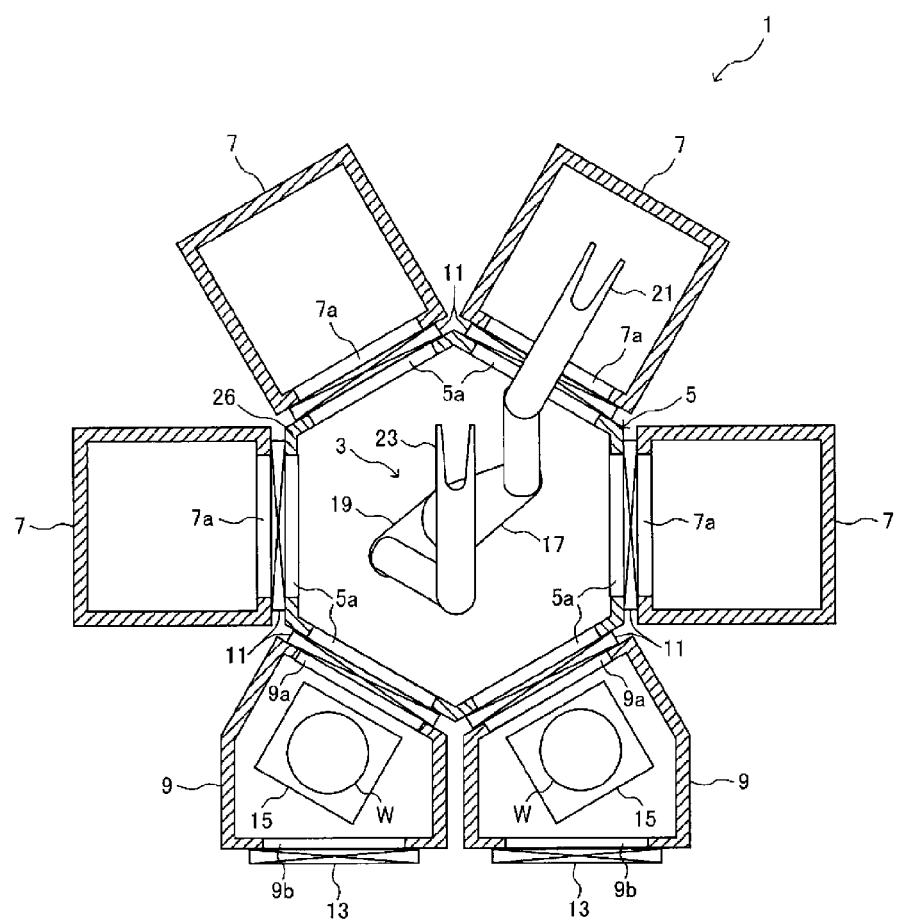
FIG. 1 is a conceptual view illustrating an example of a schematic configuration of a robot system.

First, an example of a configuration of a robot system 1 according to the present embodiment will be described with reference to FIG. 1. FIG. 1 is a conceptual view illustrating an example of a schematic configuration of the robot system 1.

The robot system 1 is a workpiece processing system that includes a vacuum robot 3 configured to transfer a workpiece W under a vacuum environment, and is applicable to various applications such as, for example, a semiconductor manufacturing system and a liquid crystal manufacturing system. In the present embodiment, descriptions will be made on a case where the robot system 1 is a semiconductor manufacturing system that processes semiconductor wafers.

As illustrated in FIG. 1, the robot system 1 includes the vacuum robot 3, a transfer chamber 5, processing chambers 7, and cassette chambers 9. The robot system 1 is a multichamber type processing system that continuously processes workpieces W which are semiconductor wafers, one by one.

The transfer chamber 5 has, for example, a substantially hexagonal shape when viewed from above, and the vacuum robot 3 is disposed therein. The processing chambers 7 and the cassette chambers 9 are arranged around the transfer chamber 5 to surround the transfer chamber 5. In each processing chamber 7, a predetermined processing is performed on a workpiece W, and in each cassette chamber 9, carry-in/out of a workpiece W are performed. The transfer chamber 5 has a plurality of connection ports 5a each opened in a predetermined size, each processing chamber 7 has a connection port 7a opened in a predetermined size, and each cassette chamber 9 has a connection port 9a opened in a predetermined size. The connection ports 5a are connected to the connection ports 7a and 9a by openable/closable gate valves 11, respectively. Further, each cassette chamber 9 has an opening 9b opened outward, and is sealed by an openable/closable gate valve 13. With this configuration, the transfer chamber 5, the processing chambers 7, and the cassette chambers 9 may be maintained in a hermetic state from each other.

The transfer chamber 5 and each processing chamber 7 are brought into a state of being depressurized to a predetermined pressure lower than an atmospheric pressure (also referred to as a vacuum state). In the cassette chamber 9, the vacuum state and the atmospheric pressure state are appropriately repeated. That is, when the gate valve 13 is opened to carry a workpiece cassette 15 into the cassette chamber 9 from the outside, the cassette chamber 9 goes to the atmospheric pressure state. Meanwhile, when the gate valve 11 is opened to connect the cassette chamber 9 to the transfer chamber 5, the cassette chamber 9 is depressurized to a pressure substantially equal to the pressure of the transfer chamber 5 and goes to the vacuum state. In the workpiece cassette 15, support shelves (not illustrated) may be provided at equal intervals, and unprocessed or processed workpieces W are stored in multiple stages.

The vacuum robot 3 is a scalar robot that includes a first arm 17 and a second arm 19 which are horizontal multi-joint type arms, and is disposed substantially at the center of the transfer chamber 5. The first arm 17 includes a first hand 21 at the tip thereof, and the second arm 19 includes a second hand 23 at the tip thereof. The vacuum robot 3 pivots and extends/retracts the first arm 17 and the second arm 19, thereby loading workpieces W on the first hand 21 and the second hand 23, and transferring the workpieces W to desired positions. Specifically, the vacuum robot 3 pivots the first arm 17 and the second arm 19 together in a state where both the first arm 17 and the second arm 19 are retracted, using a pivoting device 24 (see, e.g., FIG. 2 to be described later). Further, the vacuum robot 3 extends/retracts the first arm 17 or the second arm 19 in a state where a predetermined gate valve 11 is opened, thereby allowing the first hand 21 or the second hand 23 to enter/exit from the processing chamber 7 or the cassette chamber 9 through the connection ports 5a and 7a or 9a. At this time, the workpiece W is taken out from the processing chamber 7 or the cassette chamber 9 by being loaded on the first hand 21 or the second hand 23. Further, the workpiece W is taken into the processing chamber 7 or the cassette chamber 9 by being unloaded from the first hand 21 or the second hand 23.

Further, the vacuum robot 3 moves the first arm 17 and the second arm 19 up and down, using an elevation device 25 (see, e.g., FIG. 2 to be described later). By moving the first hand 21 and the second hand 23 up and down, the workpiece W may be lifted from or placed on, for example, a processing shelf (not illustrated) of the processing chamber 7 or a support shelf of the workpiece cassette 15. Further, by moving the first hand 21 and the second hand 23 up and down, the height positions of the first hand 21 and the second hand 23 may be adjusted with respect to, for example, the connection port 5a connected to the connection port 7a of a predetermined processing chamber 7 or a support shelf disposed at a specific position in the workpiece cassette 15.

The configuration of the robot system 1 described above is an example, and the present disclosure is not limited to the configuration described above. For example, the shape of the transfer chamber 5 may be a polygon other than a hexagon (e.g., a triangle, a quadrangle, a pentagon or an octagon). In this case, the number or the arrangement of the processing chambers 7 or the cassette chambers 9 is appropriately changed according to the shape of the transfer chamber 5.

2. Power Mechanism of Vacuum Robot

Next, an example of a power mechanism of the vacuum robot 3 will be described with reference to FIG. 2. FIG. 2 is a conceptual view illustrating an example of a schematic configuration of the power mechanism of the vacuum robot 3. FIG. 2 appropriately omits the illustration of, for example, a seal member.

Figure 2:
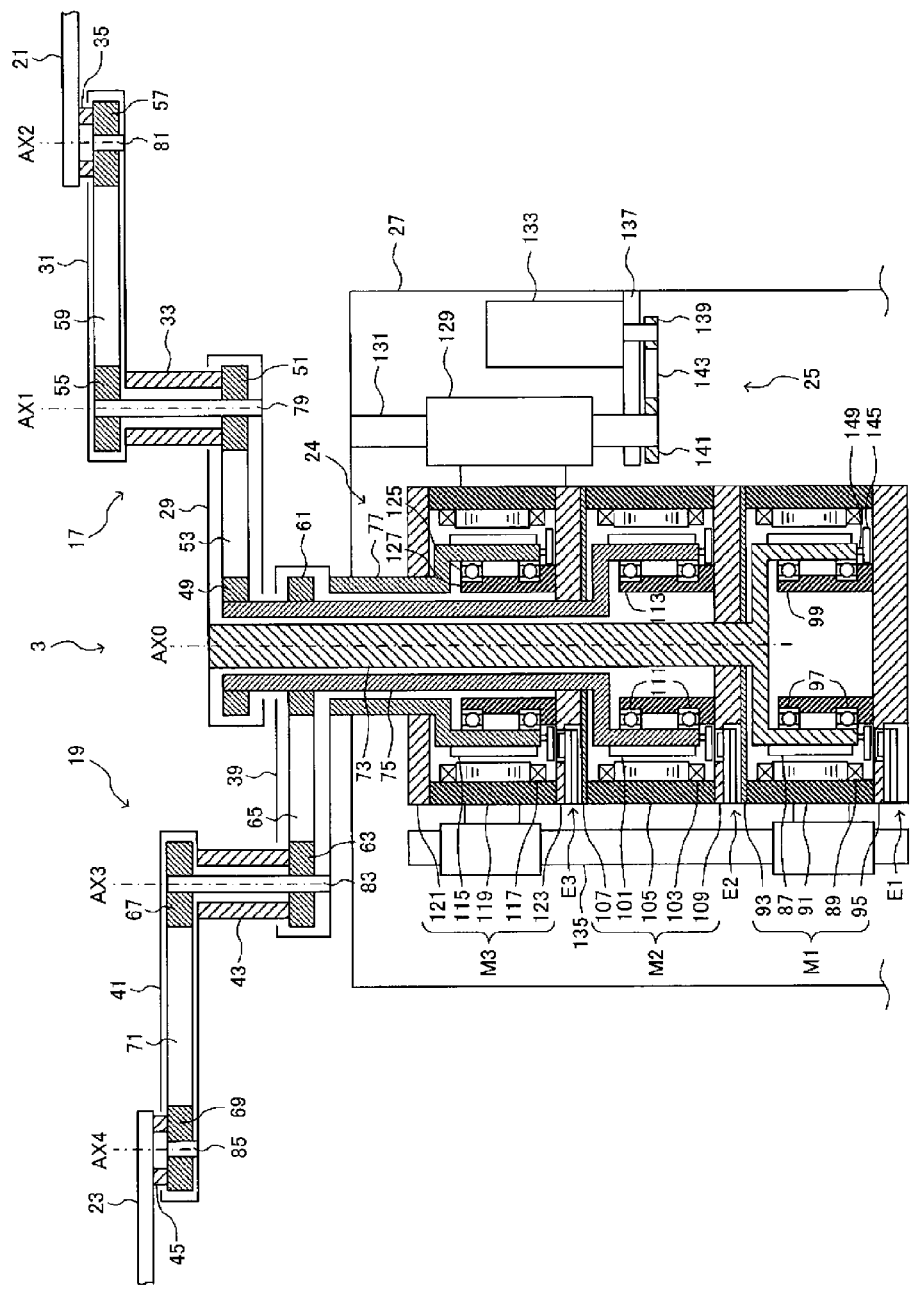
FIG. 2 is a conceptual view illustrating an example of a schematic configuration of a power mechanism of a vacuum robot.

As illustrated in FIG. 2, the vacuum robot 3 includes a base 27, the first arm 17, and the second arm 19. The base 27 is a substantially cylindrical member, and supports the first arm 17 and the second arm 19 to be pivotable and extendable/retractable. The base 27 is provided with, for example, three vacuum motors M1, M2, and M3 therein which are driving sources for the extension/retraction operation of the first arm 17, the extension/retraction operation of the second arm 19, and the pivoting operation of the first arm 17 and the second arm 19 by the pivoting device 24.

The first arm 17 includes a first base link 29, a first intermediate link 31, and the first hand 21. The first base link 29 is provided on the top of the base 27 (e.g., the top of a second base link 39 of the second arm 19) to be rotatable around the pivoting axis AX0. The first intermediate link 31 is connected to the tip portion of the first base link 29 via a connection member 33 to be rotatable around a first rotation axis AX1. The first hand 21 is connected to the tip portion of the first intermediate link 31 via a connection member 35 to be rotatable around a second rotation axis AX2.

The second arm 19 includes the second base link 39, a second intermediate link 41, and the second hand 23. The second base link 39 is provided on the top of the base 27 to be rotatable around the pivoting axis AX0. The second intermediate link 41 is connected to the tip portion of the second base link 39 via a connection member 43 to be rotatable around a third rotation axis AX3. The second hand 23 is connected to the tip portion of the second intermediate link 41 via a connection member 45 to be rotatable around a fourth rotation axis AX4.

The first arm 17 includes pulleys 49 and 51 and a belt 53 that are disposed inside the first base link 29, and pulleys 55 and 57 and a belt 59 that are disposed inside the first intermediate link 31. The pulley 49 is disposed at the base end portion of the first base link 29, and the pulley 51 is disposed at the tip portion of the first base link 29. The belt 53 wraps around the pulleys 49 and 51. The pulley 55 is disposed at the base end portion of the first intermediate link 31, and the pulley 57 is disposed at the tip portion of the first intermediate link 31. The belt 59 wraps around the pulleys 55 and 57.

Similarly, the second arm 19 includes pulleys 61 and 63 and a belt 65 that are disposed inside the second base link 39, and pulleys 67 and 69 and a belt 71 that are disposed inside the second intermediate link 41. The pulley 61 is disposed at the base end portion of the second base link 39, and the pulley 63 is disposed at the tip portion of the second base link 39. The belt 65 wraps around the pulleys 61 and 63. The pulley 67 is disposed at the base end portion of the second intermediate link 41, and the pulley 69 is disposed at the tip portion of the second intermediate link 41. The belt 71 wraps around the pulleys 67 and 69.

The belts 53, 59, 65, and 71 may be made of a metal such as a steel plate, or may be made of rubber or resin. The belts 53, 59, 65, and 71 may be, for example, toothed belts, toothless flat belts or V-belts. The pulleys 49, 51, 55, 57, 61, 63, 67, and 69 may be, for example, toothed pulleys, toothless flat pulleys or V-pulleys.

The vacuum robot 3 includes a first pivoting shaft member 73, a second pivoting shaft member 75, and a third pivoting shaft member 77 that extend in the axial direction of the pivoting axis AX0. The first pivoting shaft member 73 is a solid or hollow shaft member that is supported to be rotatable around the pivoting axis AX0. The second pivoting shaft member 75 is a hollow shaft member that is concentrically disposed outside the first pivoting shaft member 73 in the diameter direction thereof, and supported to be rotatable around the pivoting axis AX0. The third pivoting shaft member 77 is a hollow shaft member that is concentrically disposed outside the second pivoting shaft member 75 in the diameter direction thereof, and supported to be rotatable around the pivoting axis AX0. The first pivoting shaft member 73, the second pivoting shaft member 75, and the third pivoting shaft member 77 are connected to separate vacuum motors, respectively, and configured to be rotatable relative to each other.

The upper end of the first pivoting shaft member 73 is fixed to the base end portion of the first base link 29. The upper end of the third pivoting shaft member 77 is fixed to the base end portion of the second base link 39. The pulleys 49 and 61 are fixed to the upper end side of the second pivoting shaft member 75. The pulley 49 is disposed above the pulley 61.

A fixing shaft 79 is fixed to the bottom surface of the tip portion of the first base link 29. The pulley 51 is rotatably supported to the lower end side of the fixing shaft 79. The pulley 55 is fixed to the upper end side of the fixing shaft 79. The base end portion of the first intermediate link 31 is fixed to the pulley 51 via the connection member 33. A fixing shaft 81 is fixed to the bottom surface of the tip portion of the first intermediate link 31. The pulley 57 is rotatably supported on the fixing shaft 81. The base end portion of the first hand 21 is fixed to the pulley 57 via the connection member 35. The diameter of each of the pulleys 49, 51, 55, and 57 (e.g., a pulley diameter) is set to an appropriate ratio (e.g., a pulley ratio) such that, for example, the first hand 21 moves straight along the diameter direction centered on the pivoting axis AX0.

Similarly, a fixing shaft 83 is fixed to the bottom surface of the tip portion of the second base link 39. The pulley 63 is rotatably supported to the lower end side of the fixing shaft 83. The pulley 67 is fixed to the upper end side of the fixing shaft 83. The base end portion of the second intermediate link 41 is fixed to the pulley 63 via the connection member 43. A fixing shaft 85 is fixed to the bottom surface of the tip portion of the second intermediate link 41. The pulley 69 is rotatably supported on the fixing shaft 85. The base end portion of the second hand 23 is fixed to the pulley 69 via the connection member 45. The diameter of each of the pulleys 61, 63, 67, and 69 (e.g., a pulley diameter) is set to an appropriate ratio (e.g., a pulley ratio) such that, for example, the second hand 23 moves straight along the diameter direction centered on the pivoting axis AX0.

A magnet 87 is provided at the lower end of the first pivoting shaft member 73. A stator coil 89 is provided outside the magnet 87 in the diameter direction to face the magnet 87. The stator coil 89 is fixed to the inner peripheral surface of a cylindrical frame 91. A first cover 93 is fixed to the load side of the frame 91 (e.g., the upper side in FIG. 2), and a first bracket 95 is fixed to the counter load side of the frame 91 (e.g., the lower side in FIG. 2). The first bracket 95 indirectly supports a bearing 97 that rotatably supports the first pivoting shaft member 73, via a support member 99. Accordingly, the first bracket 95 corresponds to an example of a "bearing support member." For example, the magnet 87, the stator coil 89, the frame 91, the first cover 93, the first bracket 95, the bearing 97, and the support member 99 make up a first vacuum motor M1.

Similarly, a magnet 101 is provided at the lower end of the second pivoting shaft member 75. A stator coil 103 is provided outside the magnet 101 in the diameter direction to face the magnet 101. The stator coil 103 is fixed to the inner peripheral surface of a cylindrical frame105. A second cover 107 is fixed to the load side of the frame 105 (e.g., the upper side in FIG. 2), and a second bracket 109 is fixed to the counter load side of the frame 105 (e.g., the lower side in FIG. 2). The second bracket 109 indirectly supports a bearing 111 that rotatably supports the second pivoting shaft member 75, via a support member 113. Accordingly, the second bracket 109 corresponds to an example of a "bearing support member." For example, the magnet 101, the stator coil 103, the frame 105, the second cover 107, the second bracket 109, the bearing 111, and the support member 113 make up a second vacuum motor M2.

Similarly, a magnet 115 is provided at the lower end of the third pivoting shaft member 77. A stator coil 117 is provided outside the magnet 115 in the diameter direction to face the magnet 115. The stator coil 117 is fixed to the inner peripheral surface of a cylindrical frame 119. A third cover 121 is fixed to the load side of the frame 119 (e.g., the upper side in FIG. 2), and a third bracket 123 is fixed to the counter load side of the frame 119 (e.g., the lower side in FIG. 2). The third bracket 123 indirectly supports a bearing 125 that rotatably supports the third pivoting shaft member 77, via a support member 127. Accordingly, the third bracket 123 corresponds to an example of a "bearing support member." For example, the magnet 115, the stator coil 117, the frame 119, the third cover 121, the third bracket 123, the bearing 125, and the support member 127 make up a third vacuum motor M3.

The vacuum motors M1, M2, and M3 are arranged in the base 27 by being stacked in the axial direction of the pivoting axis AX0. The third vacuum motor M3 is disposed close to the upper side of the base 27, the first vacuum motor M1 is disposed close to the lower side of the base 27, and the second vacuum motor M2 is disposed between the third vacuum motor M3 and the first vacuum motor M1.

When the first vacuum motor M1 is driven to rotate the first pivoting shaft member 73 around the pivoting shaft AX0 in a stopped state of the second vacuum motor M2 where the second pivoting shaft member 75 is stationary, the first arm 17 is extended/retracted. When the third vacuum motor M3 is driven to rotate the third pivoting shaft member 77 around the pivoting axis AX0 in the stopped state of the second vacuum motor M2 where the second pivoting shaft member 75 is stationary, the second arm 19 is extended/retracted. When the first vacuum motor M1 and the third vacuum motor M3 are simultaneously driven to simultaneously rotate the first pivoting shaft member 73 and the third pivoting shaft member 77 around the pivoting axis AX0 in the stopped state of the second vacuum motor M2 where the second pivoting shaft member 75 is stationary, the first arm 17 and the second arm 19 are simultaneously extended/retracted.

When the first vacuum motor M1, the second vacuum motor M2, and the third vacuum motor M3 are simultaneously driven to rotate the first pivoting shaft member 73, the second pivoting shaft member 75, and the third pivoting shaft member 77 at the same rotation speed in the same rotation direction by the same angle, the first arm 17 and the second arm 19 are pivoted around the pivoting axis AX0 while maintaining the positional relationship thereof in the circumferential direction of the pivoting axis AX0, without performing the extension/retraction operation. For example, the first vacuum motor M1, the second vacuum motor M2, the third vacuum motor M3, the first pivoting shaft member 73, the second pivoting shaft member 75, and the third pivoting shaft member 77 make up the pivoting device 24.

The vacuum robot 3 includes the elevation device 25 that moves the first arm 17 and the second arm 19 together up and down in the axial direction (vertical direction) of the pivoting axis AX0 while maintaining the positional relationship of the first arm 17 and the second arm 19 in the circumferential direction. As illustrated in FIG. 2, the elevation device 25 includes, for example, a slider 129, a transport screw 131, an elevation motor 133, and a linear guide 135. The elevation motor 133 is provided beside the vacuum motors M1, M2, and M3 in the base 27, and is supported by a support member 137. The transport screw 131 is supported by a bearing (not illustrated) to be rotatable with respect to the support member 137 and the upper end of the base 27. The vacuum motors M1, M2, and M3 are provided to be movable vertically in the base 27 by the linear guide 135. A pulley 139 is provided at an output shaft disposed below the elevation motor 133, and a pulley 141 is provided at the lower end portion of the transport screw 131. A belt 143 wraps round the pulleys 139 and 141. The elevation motor 133 rotates the transport screw 131 by the pulleys 139 and 141 and the belt 143. The slider 129 is connected to at least one of the vacuum motors M1, M2, and M3, and moves vertically by the rotation of the transport screw 131. Thus, the first arm 17 and the second arm 19 move up and down in the axial direction of the pivoting axis AX0 together with the first vacuum motor M1, the second vacuum motor M2, the third vacuum motor M3 and others, by the driving of the elevation motor 133. The installation position of the elevation device 25 is not limited to the portion beside the vacuum motors M1, M2, and M3, and for example, the elevation device 25 may be provided below the vacuum motors M1, M2, and M3. Further, the elevation device 25 may be provided outside the base 27.

Since the vacuum robot 3 is disposed in the transfer chamber 5 in the vacuum state, the internal space of each of the vacuum motors M1, M2, and M3 that communicates with the vacuum space becomes the vacuum state. Meanwhile, the external space of each of the vacuum motors M1, M2, and M3, that is, the internal space of the base 27 where the elevation device 25, the linear guide 112 and others are disposed becomes the atmospheric pressure state.

The vacuum motors M1, M2, and M3 include vacuum motor encoders E1, E2, and E3, respectively, that detect the rotation positions (e.g., the rotational speeds or the rotation accelerations) of the motors. Although described later in detail, a portion of the vacuum motor encoder E1 of the first vacuum motor M1 is accommodated in the first bracket 95. A portion of the vacuum motor encoder E2 of the second vacuum motor M2 is accommodated in the second bracket 109. A portion of the vacuum motor encoder E3 of the third vacuum motor M3 is accommodated in the third bracket 123.

3. Configuration of Vacuum Motor Encoder and Bracket

Figure 3:
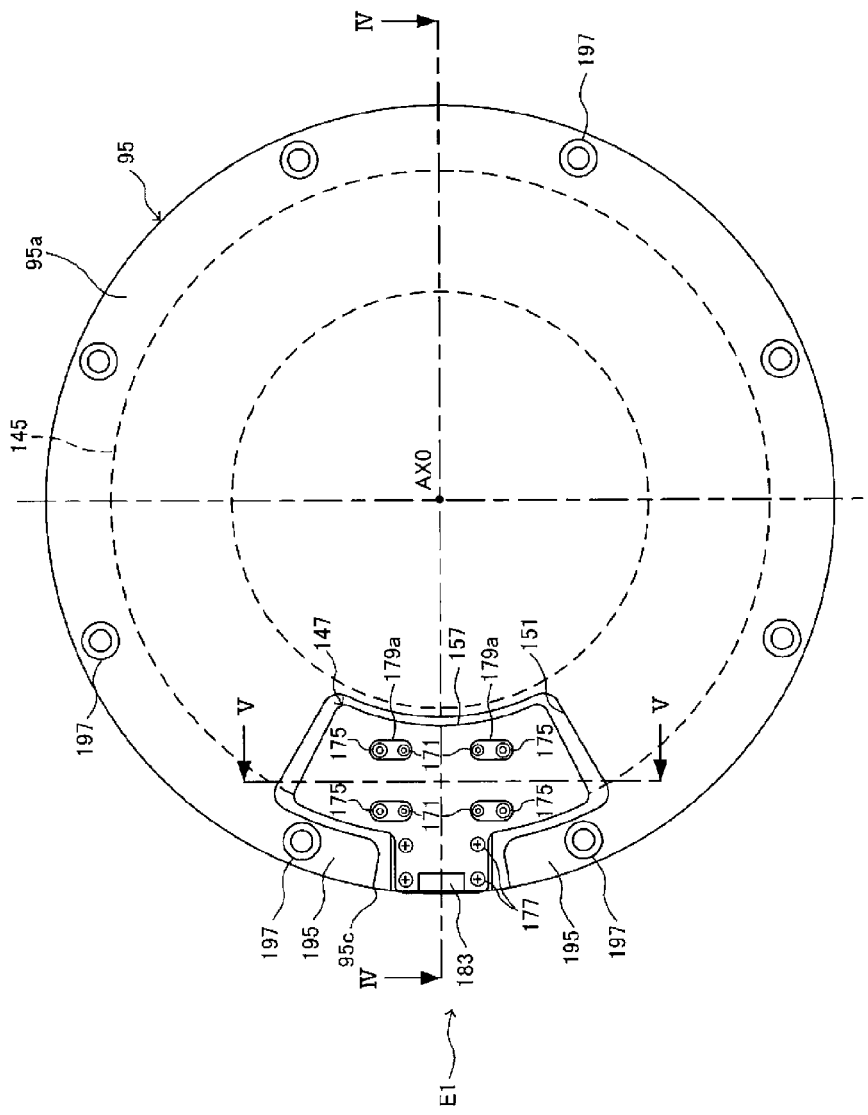
FIG. 3 is a bottom view illustrating an example of a configuration of a vacuum motor encoder and a first bracket of a vacuum motor, when the first bracket is viewed from bottom in an axial direction of a pivoting axis.
Figure 4:
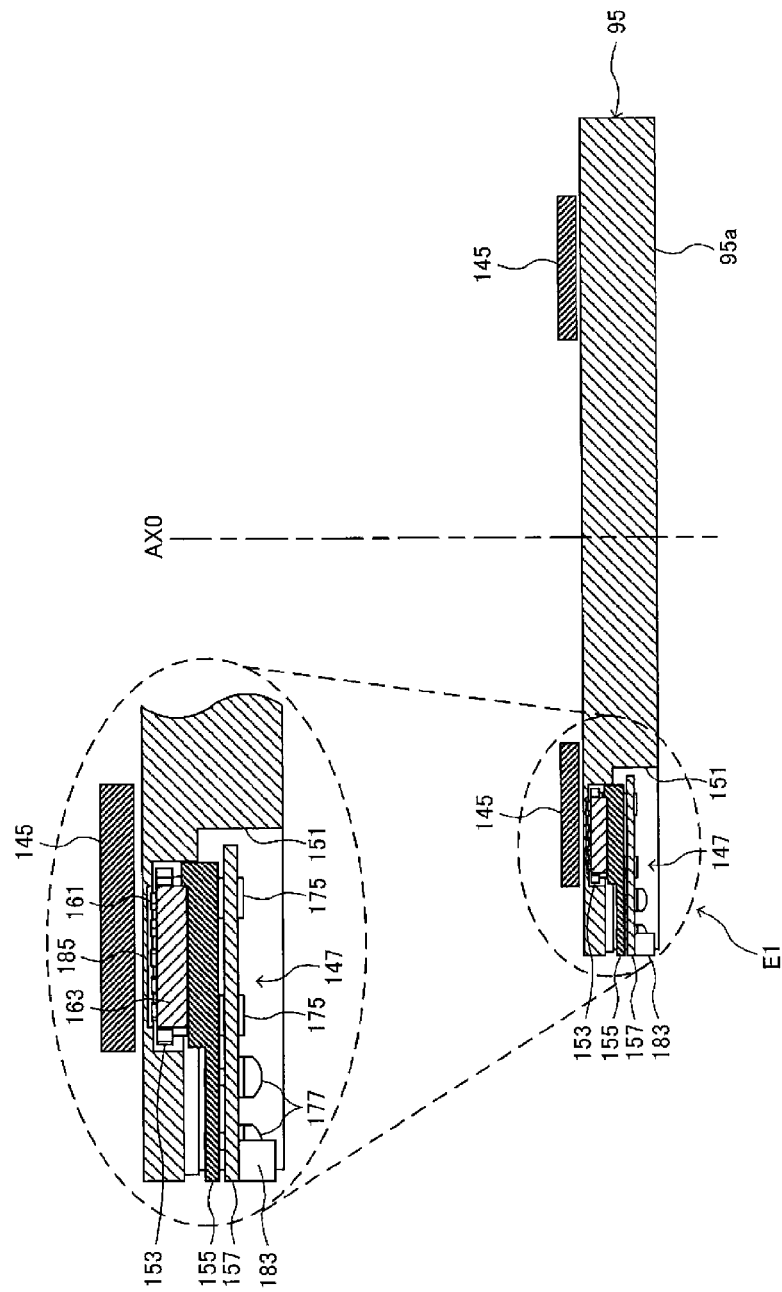
FIG. 4 is a cross-sectional view taken along the line IV-IV of FIG. 3.
Figure 5:
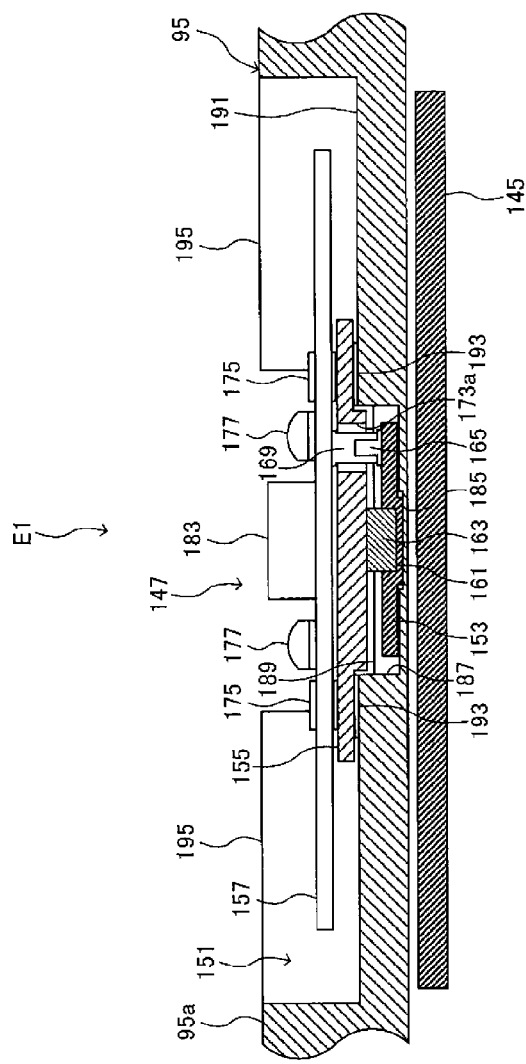
FIG. 5 is a cross-sectional view taken along the line V-V of FIG. 3.
Figure 6:
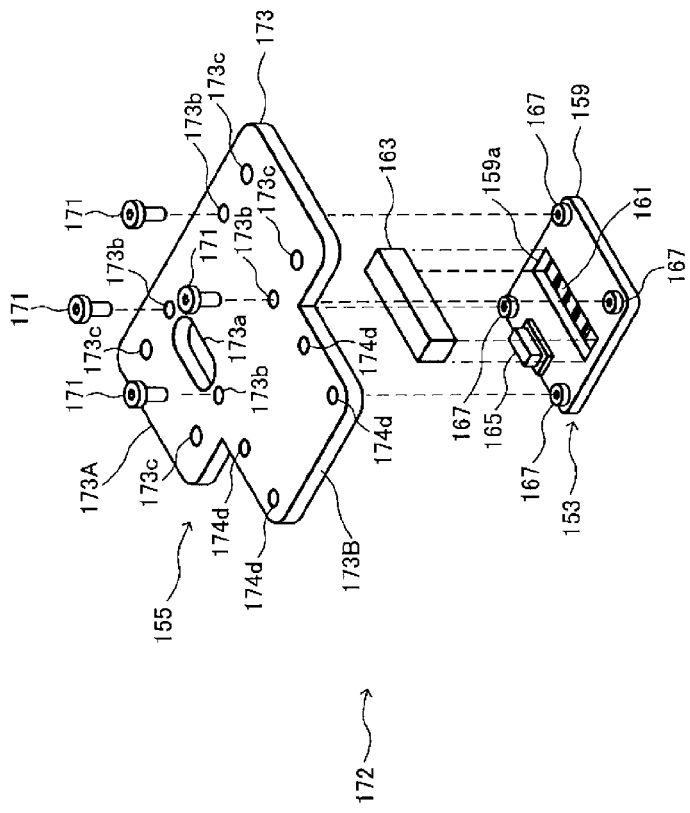
FIG. 6 is an exploded perspective view illustrating an example of an assembling structure of a sensor head board and a sensor support member.
Figure 7:
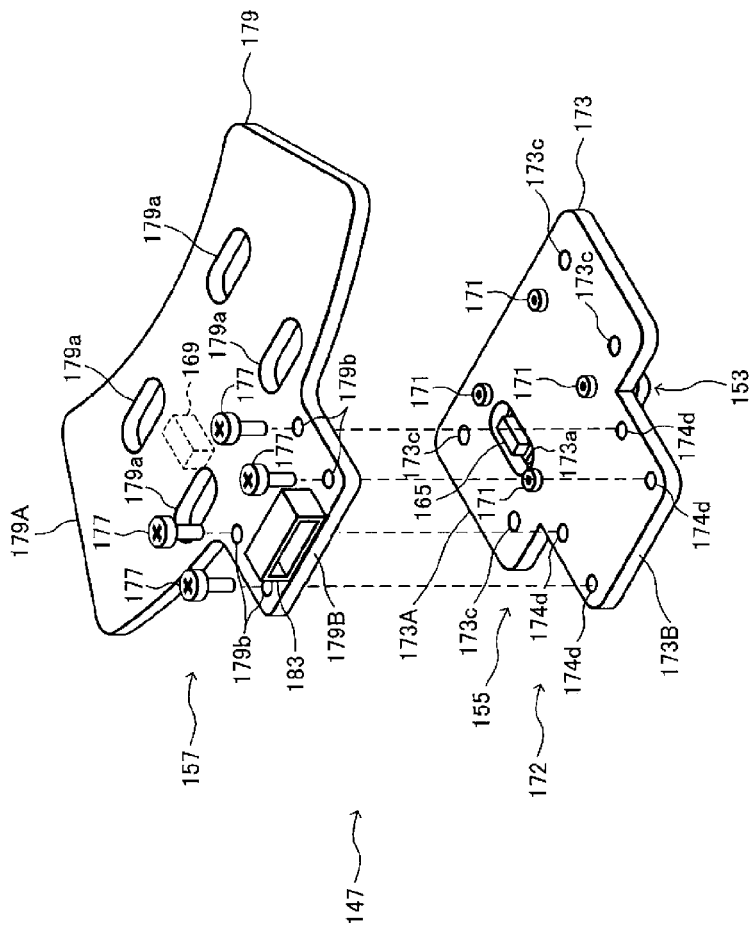
FIG. 7 is an exploded perspective view illustrating an example of an assembling structure of an intermediate unit configured by assembling the sensor head board and the sensor support member, and a signal processing board.
Figure 8:
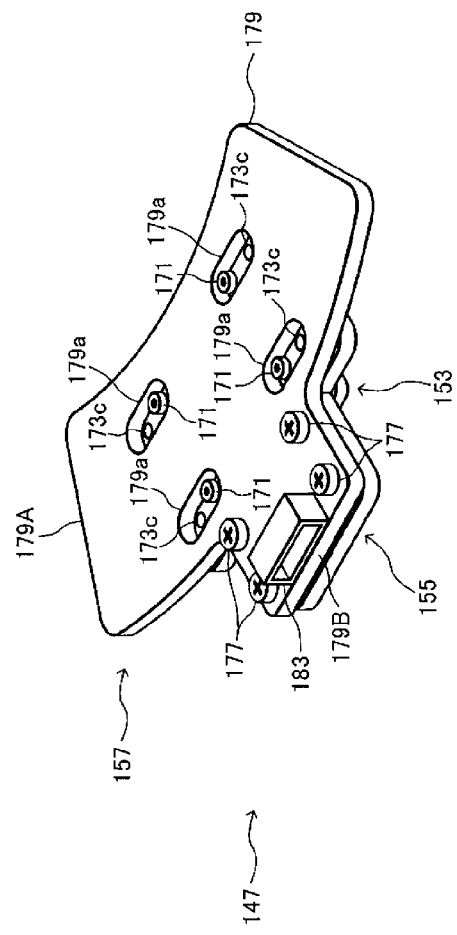
FIG. 8 is a perspective view illustrating an example of a structure of a sensor unit configured by assembling the intermediate unit and the signal processing board.
Figure 9:
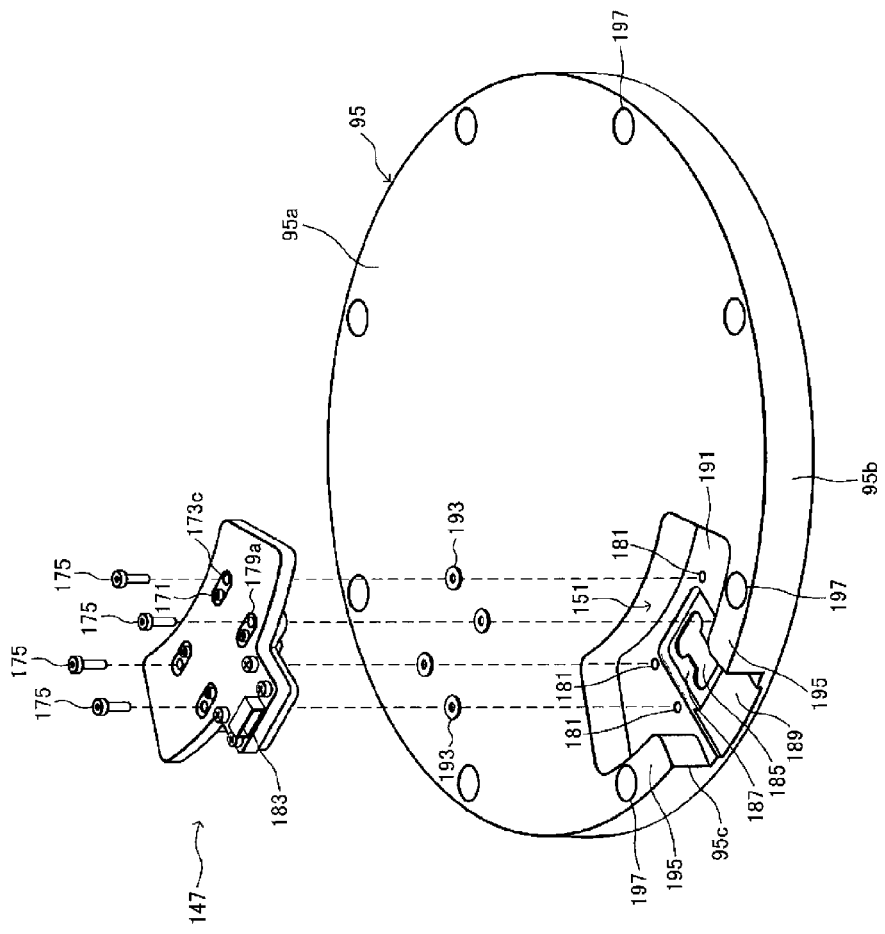
FIG. 9 is an exploded perspective view illustrating an example of an assembling structure of the sensor unit and the first bracket.

Next, an example of a configuration of the vacuum motor encoder and the bracket will be described with reference to FIGS. 3 to 9. FIG. 3 is a bottom view illustrating an example of the configuration of the vacuum motor encoder E1 and the first bracket 95 of the first vacuum motor M1, when the first bracket 95 is viewed from below in the axial direction of the pivoting axis AX0. FIG. 4 is a cross-sectional view taken along the line IV-IV of FIG. 3, and includes an enlarged view of a portion of the vacuum motor encoder E1. FIG. 5 is a cross-sectional view taken along the line V-V of FIG. 3. FIG. 6 is an exploded perspective view illustrating an example of an assembling structure of a sensor head board and a sensor support member. FIG. 7 is an exploded perspective view illustrating an example of an assembling structure of an intermediate unit configured by assembling the sensor head board and the sensor support member, and a signal processing board. FIG. 8 is a perspective view illustrating an example of a structure of a sensor unit configured by assembling the intermediate unit and the signal processing board. FIG. 9 is an exploded perspective view illustrating an example of an assembling structure of the sensor unit and the first bracket. FIG. 4 omits the illustration of the configuration of the first vacuum motor M1 other than the vacuum motor encoder E1 and the first bracket 95.

As illustrated in FIGS. 3 to 5, the vacuum motor encoder E1 includes a disk 145 and a sensor unit 147. The disk 145 is fixed to the lower end of the first pivoting shaft member 73 by a fixing member 149 (see, e.g., FIG. 2), and disposed to be rotatable together with the first pivoting shaft member 73. The disk 145 is made of a magnetic material, and a plurality of slits (not illustrated) is formed circumferentially in the disk 145. In the present embodiment, a plurality of slit tracks (e.g., five slit tracks) is concentrically formed in the diameter direction of the disk 145. The number of tracks may be one or more other than five. Each slit may be a concave portion or a through hole.

The sensor unit 147 (e.g., a magnetic sensor) is configured by combining a plurality of components, and outputs detection signals by magnetically detecting the slits of the disk 145. The sensor unit 147 measures the slits by using the magnetoresistance effect in which the electric resistance of a solid changes with a magnetic field. In the present embodiment, descriptions are made on, for example, a case where the sensor unit 147 includes semiconductor magnetoresistance (SMR) elements. However, for example, anisotropic magnetoresistance (AMR) elements, giant magnetoresistance (GMR) elements or tunnel magnetoresistance (TMR) elements may be used.

A recess 151 is formed in the surface 95a of the lower side of the first bracket 95 (e.g., the lower side in FIG. 4; the upper side in FIG. 5; an example of one side in the axial direction; also referred to as the counter load side), to be dented in the axial direction toward the upper side of the first bracket 95 (e.g., the upper side in FIG. 4; the lower side in FIG. 5; an example of the other side in the axial direction; also referred to as the load side). The sensor unit 147 is accommodated in the recess 151, and disposed to face the disk 145 in the axial direction via a thin wall 185 and others formed by the recess 151. As illustrated in FIGS. 4 and 5, the recess 151 has an axial depth larger than the thickness of the sensor unit 147 in the axial direction, and accommodates the sensor unit 147 therein while preventing the sensor unit 147 from protruding from the surface 95a of the lower side of the first bracket 95.

As illustrated in FIGS. 4 and 5, the sensor unit 147 includes a sensor head board 153, a sensor support member 155, and a signal processing board 157. The sensor head board 153, the sensor support member 155, and the signal processing board 157 are accommodated in the recess 151 by being stacked in this order from above (e.g., the upper side in FIG. 4; the lower side in FIG. 5) in the axial direction. The recess 151 has an axial depth larger than the total thickness of the stacked sensor head board 153, sensor support member 155, and signal processing board 157 in the axial direction.

As illustrated in FIG. 6, the sensor head board 153 includes a board body 159, magnetoresistance elements 161, a bias magnet 163, a connector 165, and fixing nuts 167. The board body 159 is, for example, a substantially square board. A plurality of magnetoresistance elements 161 (e.g., five in this example) is provided below the board body 159, and arranged to face the disk 145 via the thin wall 185 which is the thinnest portion of the first bracket 95. The number of magnetoresistance elements 161 is not limited to five, and has only to be the same as the number of slit tracks formed in the disk 145. The bias magnet 163 is fitted into a recess 159a formed substantially at the center of the board body 159. Accordingly, the magnetoresistance elements 161 are disposed between the bias magnet 163 and the disk 145. The upper surface of the bias magnet 163 is fixed to the lower surface of the sensor support member 155 by, for example, adhesion. The connector 165 is provided near the outer peripheral end of one side of the board body 159, and connected to a connector 169 of the signal processing board 157 (see, e.g., FIGS. 5 and 7) by penetrating a connector insertion through hole 173a of the sensor support member 155. The connectors 165 and 169 ensure a communication between the sensor head board 153 and the signal processing board 157. A plurality of fixing nuts 167 (e.g., four in this examples) is provided, for example, near the four corners of the board body 159. Fixing bolts 171 are fastened into the fixing nuts 167, respectively, by being inserted through bolt insertion through holes 173b of the sensor support member 155. As a result, the sensor head board 153 and the sensor support member 155 are assembled and fixed to each other. In the present embodiment, the component configured by assembling the sensor head board 153 and the sensor support member 155 may be referred to as an "intermediate unit 172" for the convenience of description.

The sensor support member 155 is intended to support the sensor head board 153 and fix the sensor head board 153 to the recess 151. As illustrated in FIGS. 6 and 7, the sensor support member 155 includes a member body 173. The member body 173 includes a substantially rectangular first member body 173A that extends such that the long side thereof substantially follows the circumferential direction of the pivoting axis AX0, and a substantially rectangular second member body 173B that projects outward from the first member body 173A in the diameter direction (e.g., the diameter direction centered on the pivoting axis AX0). Two of the bolt insertion through holes 173b described above are formed in one of both sides of the first member body 173A in the circumferential direction, and the remaining two are formed in the other side. The four fixing bolts 171 are inserted through the four bolt insertion through holes 173b, respectively, and fastened into the fixing nuts 167 of the sensor head board 153, respectively. The connector insertion through hole 173a described above is formed between the two bolt insertion through holes 173b formed in one of both sides of the first member body 173A in the circumferential direction. Two bolt insertion through holes 173c are formed in each of both sides of the first member body 173A further outside the bolt insertion through holes 173b in the circumferential direction, such that fixing bolts 175 (see, e.g., FIG. 9) are inserted through the bolt insertion through holes 173c to fix the sensor unit 147 to the first bracket 95. A plurality of bolt fastening holes 174d (e.g., four in this example) is formed near the four corners of the second member body 173B, to fix the signal processing board 157 to the sensor support member 155. A screw groove is formed in the internal side of each bolt fastening hole 174d, and a plurality of fixing bolts 177 (e.g., four in this example) (see, e.g., FIG. 7) is fastened into the bolt fastening holes 174d, respectively.

In the present embodiment, the sensor support member 155 is made of a non-magnetic material. As a result, it is possible to avoid that, for example, the magnetic force of the bias magnet 163 attracts nearby unrelated magnetic materials. Examples of the non-magnetic material include non-magnetic stainless steel, resin, ceramics, titanium alloy, and aluminum alloy. In the present embodiment, the sensor support member 155 is made of a material having the strength substantially equal to that of the first bracket 95. As a result, the sensor support member 155 may be firmly fixed to the first bracket 95. Examples of the material having the strength substantially equal to that of the first bracket 95 include stainless steel, alloy steel, and titanium alloy. In the present embodiment, the sensor support member 155 is made of, for example, a non-magnetic stainless steel material.

The signal processing board 157 processes a signal of the sensor head board 153. For example, the signal processing board 157 converts an analog signal output from the sensor head board 153 into a digital signal, and executes a signal processing for performing a serial communication with an external device. Another signal processing may be executed. As illustrated in FIGS. 7 and 8, the signal processing board 157 includes a board body 179 and a connector 183. The board body 179 includes a substantially fan-shaped first board body 179A that extends in an arc form along the circumferential direction of the pivoting axis AX0, and a substantially rectangular second board body 179B that projects outward from the first board body 179A in the diameter direction (e.g., the diameter direction centered on the pivoting axis AX0). Two elongated holes 179a are formed in each of both sides of the first board body 179A in the circumferential direction. The elongated holes 179a accommodate the heads of the fixing bolts 171, respectively, when the intermediate unit 172 and the signal processing board 157 are assembled. Further, the bolt insertion through holes 173c of the sensor support member 155 are exposed through the elongated holes 179a. As a result, when the sensor unit 147 is fixed to the first bracket 95, the fixing bolts 175 may be inserted through the bolt insertion through holes 173c exposed through the elongated holes 179a, and fastened into bolt fastening holes 181 formed in the recess 151 of the first bracket 95 (see, e.g., FIG. 9), respectively. A plurality of bolt insertion through holes 179b (e.g., four in this example) is formed near the four corners of the second board body 179B to allow the insertion of the fixing bolts 177 described above. The fixing bolts 177 inserted through the bolt insertion through holes 179b are fastened into the bolt fastening holes 174d of the sensor support member 155, respectively. As a result, the signal processing board 157 and the intermediate unit 172 are assembled and fixed to each other. In the present embodiment, the component configured by assembling the signal processing board 157 and the intermediate unit 172 is referred to as the "sensor unit 147." The connector 183 is provided at the outer end of the second board body 179B in the diameter direction. The connector 183 is exposed to the outside by being disposed in an opening 95c formed in the outer peripheral surface 95b of the first bracket 95 (see, e.g., FIGS. 3 and 9). A cable connector (not illustrated) is connected to the connector 183 to supply a power or perform a communication with an external device.

The first bracket 95 is made of a non-magnetic material. Although not specifically limited, the non-magnetic material may be, for example, non-magnetic stainless steel having a relatively high strength because the first bracket 95 is a structural member under the load of the bearing, and the thin wall 185 to be described later needs to bear the pressure difference between the atmospheric pressure and the vacuum. Another non-magnetic material may be used. As illustrated in FIG. 9, the recess 151 is formed in the surface 95a of the lower side of the first bracket 95 (e.g., the upper side in FIG. 9; an example of one side in the axial direction; also referred to as the counter load side), to be dented in the axial direction toward the upper side of the first bracket 95 (e.g., the lower side in FIG. 9; an example of the other side in the axial direction; also referred to as the load side). The recess 151 is formed such that the dent thereof in the axial direction reaches the outer peripheral surface 95b of the first bracket 95 in the diameter direction (e.g., the outer surface of the first bracket 95 in the diameter direction). As a result, the opening 95c is formed in the outer peripheral surface 95b of the first bracket 95. The recess 151 is formed by, for example, a cutting processing. Instead of the cutting, for example, the recess 151 may be molded by a casting that pours a liquid metal into a mold of a bracket with a recess formed therein.

The recess 151 is formed to have axial depths that are different in stages, and the bottom of the recess 151 is formed in a stepwise fashion having a plurality of stepped portions. The substantially central portion of the recess 151 is the deepest in axial depth, and the bottom of the substantially central portion of the recess 151 serves as the thin wall 185. The thin wall 185 is the portion of the first bracket 95 that is the thinnest in axial thickness (e.g., about 0.2 mm), and is formed in a shape in which, for example, two elongated holes are connected to each other by a quadrangle when viewed from the axial direction (see, e.g., FIG. 9). The magnetoresistance elements 161 described above are arranged with a minute gap (e.g., about 0.6 mm) from the surface of the disk 145 in the axial direction via the thin wall 185. By the thin wall 185, the space where the sensor unit 147 is disposed under the atmospheric pressure is isolated from the vacuum space that the disk 145 is disposed under a reduced pressure lower than the atmospheric pressure.

An accommodation portion 187 is formed around the thin wall 185 to surround the thin wall 185, is shallower in axial depth than the thin wall 185, and has a substantially square shape when viewed from the axial direction. The bottom of the accommodating portion 187 is thicker in axial thickness than the thin wall 185. The accommodation portion 187 accommodates a portion of the sensor head board 153 or the entire sensor head board 153. The portions of the sensor head board 153 other than the magnetoresistance elements 161 are disposed in contact with or with a minute gap from the bottom of the accommodation portion 187.

A groove 189 is formed close to the outer side of the accommodation portion 187 in the diameter direction to extend along the diameter direction, and is shallower in axial depth than the accommodation portion 187. The bottom of the groove 189 is thicker in axial thickness than the bottom of the accommodation portion 187. The groove 189 is formed to reach the outer peripheral surface 95b of the first bracket 95, and communicates with the opening 95c. The groove 189 is formed in a shape that corresponds to the second member body 173B of the sensor support member 155, and forms an available space to prevent the tips of the fixing bolts 177 for fixing the signal processing board 157 to the sensor support member 155 from coming into contact with the recess 151.

An mounting portion 191 is formed around the accommodation portion 187 and the groove 189 to surround both sides of the accommodation portion 187 and the groove 189 in the circumferential direction and the inner side of the accommodation portion 187 in the diameter direction, is shallower in axial depth than the groove 189, and has a shape that corresponds to the signal processing board 157. The bottom of the mounting portion 191 is thicker in axial thickness than the bottom of the groove 189. Two of the bolt fastening holes 181 described above are formed in one of both sides of the mounting portion 191 close to the accommodation portion 187 in the circumferential direction, and the remaining two are formed in the other side. A screw groove is formed in the internal side of each bolt fastening hole 181. The fixing bolts 175 inserted through the bolt insertion through holes 173c of the sensor support member 155 are fastened into the bolt fastening holes 181, so that the sensor unit 147 is accommodated in and fixed to the recess 151 of the first bracket 95. At this time, each fixing bolt 175 is inserted through a shim member 193 (see, e.g., FIGS. 5 and 9) to be fastened into each bolt fastening hole 181. The shim member 193 is intended to adjust the gap between the surface of the sensor support member 155 and the surface of the mounting portion 191, thereby adjusting the gap between the surface of the magnetoresistance elements 161 and the surface of the disk 145.

As illustrated in FIGS. 3 and 9, the first bracket 95 includes two walls 195 that cover at least a portion of the outer side of the recess 151 in the diameter direction. The two walls 195 extend circumferentially from both sides of the recess 151 in the circumferential direction at the outer peripheral end of the first bracket 95 so as to approach each other, and the opening 95c described above is formed between the two walls 195. Meanwhile, near the outer peripheral end of the first bracket 95, a plurality of bolt holes 197 (e.g., eight in this example) is formed at a plurality of locations in the circumferential direction (e.g., eight with intervals of 45° in this example) to penetrate the locations in the axial direction. A fixing bolt (not illustrated) is inserted through each bolt hole 197 to fix the first bracket 95 to the frame 91. A part of the plurality of bolt holes 197 (e.g., two for the two walls 195, respectively, in this example) is formed in the two walls 195, respectively. The arrangement and the number of bolt holes 197 are not limited to those described above. Further, a bolt hole 197 may be formed only in one of the walls 195, or two or more bolt holes 197 may be formed in one of the walls 195.

The vacuum motor encoder E2 and the second bracket 109 of the second vacuum motor M2 and the vacuum motor encoder E3 and the third bracket 123 of the third vacuum motor M3 are similar in configuration to the vacuum motor encoder E1 and the first bracket 95 of the first vacuum motor M1, except that the second bracket 109 and the third bracket 123 have through holes through which the first pivoting member 73 and the second pivoting member 75 are inserted, respectively. Thus, descriptions of the components will be omitted.

4. Assembling Procedure of Sensor Unit

Next, an example of the assembling procedure of the sensor unit 147 will be described with reference to FIGS. 6 to 9.

First, as illustrated in FIG. 6, while fitting the bias magnet 163 into the recess 159a, the fixing bolts 171 inserted through the bolt insertion through holes 173b of the sensor support member 155 are fastened into the fixing nuts 167 of the sensor head board 153, respectively. As a result, the sensor head board 153 and the sensor support member 155 are assembled and fixed to each other, so that the intermediate unit 172 is manufactured.

Next, as illustrated in FIGS. 7 and 8, the fixing bolts 177 inserted through the bolt insertion through holes 179b of the signal processing board 157 are fastened into the bolt fastening holes 174d of the sensor support member 155, respectively. As a result, the signal processing board 157 and the intermediate unit 172 are assembled and fixed to each other, so that the sensor unit 147 is manufactured.

Then, as illustrated in FIG. 9, the fixing bolts 175 are inserted through the bolt insertion through holes 173c exposed through the elongated holes 179a, and fastened into the bolt fastening holes 181 formed in the recess 151 of the first bracket 95, respectively. As a result, the sensor unit 147 is accommodated in and fixed to the recess 151 of the first bracket 95. Accordingly, the magnetoresistance elements 161 of the sensor head board 153 are arranged to face the disk 145 in the axial direction via the thin wall 185 of the first bracket 95, so that the vacuum motor encoder E1 is manufactured.

5. Effects of Embodiment

As described above, the vacuum robot 3 of the present embodiment includes the vacuum motors M1, M2, and M3, and the first arm 17 and the second arm 19 that are driven by the vacuum motors M1, M2, and M3. The vacuum motor M1, M2 or M3 includes the first pivoting shaft member 73, the second pivoting shaft member 75 or the third pivoting shaft member 77 (hereinafter, referred to as the "first pivoting shaft member 73 or the like"), the bearing 97, 111 or 125 that rotatably supports the first pivoting shaft member 73 or the like, the disk 145 disposed to be rotatable together with the first pivoting shaft member 73 or the like and having slits, the first bracket 95, the second bracket 109 or the third bracket 123 (hereinafter, referred to as the "first bracket 95 or the like") that is made of a non-magnetic material and supports the bearing 97, 111 or 125, the recess 151 formed in the first bracket 95 or the like to be dented in the axial direction, and the sensor unit 147 disposed to face the disk 145 in the axial direction via the thin wall 185 formed by the recess 151. By the thin wall 185, the space where the sensor unit 147 is disposed under the atmospheric pressure is isolated from the space where the disk 145 is disposed under a reduced pressure lower than the atmospheric pressure.

In the present embodiment, the recess 151 is formed to be dented in the axial direction in the first bracket 95 or the like, and the sensor unit 147 and the disk 145 are arranged to face each other via the thin wall 185 formed by the recess 151. Since the thin wall 185 is a portion of the first bracket 95 or the like, and replaces a configuration where an opening formed in the first bracket 95 or the like is sealed, it is unnecessary to perform a sealing process with a sealing material between the sensor unit 147 and the disk 145. As a result, it is possible to reduce the generation of impurity gas caused from the heating of the sealing material. In particular, in the vacuum robot 3 that operates under the vacuum environment as in the semiconductor manufacturing system of the present embodiment, it is possible to prevent the generation of impurity gas caused from the heating of the sealing material in the vacuum space that requires the clean environment. Further, since the first bracket 95 or the like is made of a non-magnetic material, the accuracy of the slit detection by the sensor unit 147 may be ensured, by forming the thin wall 185 to be sufficiently thin. Further, since the first bracket 95 or the like is a structural member under the load of the bearing, the first bracket 95 or the like has the relatively high strength as a whole. Thus, even though the recess 151 is provided while forming the thin wall 185, the required strength may be secured.

In the present embodiment, especially, the sensor unit 147 is accommodated in the recess 151. As a result, it is unnecessary to separately provide a space where the sensor unit 147 is disposed (e.g., a sensor chamber) outside the first bracket 95 or the like, so that the vacuum motors M1, M2, and M3 and the vacuum robot 3 may be manufactured into a small size.

In the present embodiment, especially, the recess 151 has the axial depth larger than the axial thickness of the sensor unit 147. As a result, the sensor unit 147 may be prevented from protruding from the surface of the first bracket 95 or the like, so that the sensor unit 147 may be protected.

In the present embodiment, especially, the sensor unit 147 includes the sensor head board 153, the sensor support member 155 that supports the sensor head board 153, and the signal processing board 157 that processes a signal of the sensor head board 153. The sensor head board 153, the sensor support member 155, and the signal processing board 157 are accommodated in the recess 151 by being stacked in the axial direction. The recess 151 has the axial depth larger than the axial thickness of the stacked sensor head board 153, sensor support member 155, and signal processing board 157.

As a result, the sensor unit 147 may be configured by combining a plurality of components having three functions that include a detection function to detect the slits of the disk 145 (e.g., the sensor head board 153), a support/fixing function to support and fix the board to the recess 151 (e.g., the sensor support member 155), and a signal processing function to process a detection signal (e.g., the signal processing board 157) with each other. Further, since all of the stacked sensor head board 153, sensor support member 155, and signal processing board 157 may be prevented from protruding from the surface of the first bracket 95 or the like, the components may be protected.

In the present embodiment, especially, the sensor support member 155 is formed of a non-magnetic material. Thus, it is possible to avoid that, for example, the magnetic force of the bias magnet 163 attracts nearby unrelated magnetic materials. Further, when a material having the strength equal to that of the first bracket 95 is used as the non-magnetic material, the sensor support member 155 (e.g., including the sensor head board 153 and the signal processing board 157 that are fixed to the sensor support member 155) may be firmly fixed to the first bracket 95.

In the present embodiment, especially, the vacuum robot 3 includes the plurality of vacuum motors M1, M2, and M3, and the plurality of vacuum motors M1, M2, and M3 are arranged by being stacked in the axial direction.

In the present embodiment, the sensor unit 147 is accommodated in the recess 151 without protruding from the surface of the first bracket 95 or the like, so that the sensor unit 147 is prevented from interfering with the adjacent vacuum motor even when the plurality of vacuum motors M1, M2, and M3 are stacked in the axial direction. Thus, the vacuum robot 3 may be implemented in a compact size.

In the present embodiment, especially, the recess 151 is formed in the surface 95a of one side of the first bracket 95 or the like in the axial direction to be dented toward the other side thereof, and the dent in the axial direction is formed to reach the outer peripheral surface 95b of the first bracket 95 or the like in the diameter direction.

Thus, the opening 95c may be formed by the recess 151 in the outer peripheral surface 95b of the first bracket 95 or the like. As a result, the wiring of the sensor unit 147 accommodated in the recess 151 may be pulled out radially outward through the opening 95c.

In the present embodiment, especially, the sensor unit 147 includes the sensor head board 153 and the signal processing board 157 that processes a signal of the sensor head board 153, and the signal processing board 157 includes the connector 183 disposed in the opening 95c formed by the recess 151 in the outer peripheral surface 95b.

As a result, the connector 183 of the signal processing board 157 may be exposed to the outside through the opening 95c, so that a connection work of an external wiring may be easily performed. Further, the signal processing board 157 converts, for example, a signal output from the sensor to the serial form, so that wirings may be saved.

In the present embodiment, especially, the sensor unit 147 includes the sensor head board 153 and the sensor support member 155 that supports the sensor head board 153. Further, the recess 151 is thicker in axial thickness than the thin wall 185, and includes the mounting portion 191 therein in which the sensor support member 155 is mounted.

By mounting the sensor support member 155 that supports the sensor head board 153 and others in the mounting portion 191 having the thicker thickness than that of the thin wall 185, it is possible to secure a fastening space (e.g., fastening depth) of the fixing bolts 175 for fixing the sensor support member 155 to the first bracket 95 or the like. As a result, the sensor unit 147 may be stably fixed in the recess 151.

In the present embodiment, especially, the first bracket 95 or the like includes the walls 195 that cover at least a portion of the outer side of the recess 151 in the diameter direction, and a part of the plurality of bolt holes 197 that are arranged at the plurality of locations on the first bracket 195 or the like in the circumferential direction and penetrate the locations in the axial direction is formed in the walls 195.

As a result, it is possible to prevent a decrease in number of fastening locations of the bolts for fixing the first bracket 95 or the like to the frame 91, 105 or 119 due to the formation of the recess 151. Accordingly, the fastening strength of the first bracket 95 or the like with respect to the frame may be secured.

6. Modifications

The embodiment of the present disclosure is not limited to that described above, and various modifications may be made within a scope that does not depart from the gist and the technical idea of the present disclosure.

For example, in the descriptions above, a case where the vacuum robot 3 includes the two arms 17 and 19 has been described as an example. However, the number of arms is not limited to two, and the vacuum robot 3 may have one arm or three or more arms.

In the descriptions above, a case where the three vacuum motors M1, M2, and M3 are arranged by being stacked in the axial direction has been described as an example. However, the number of vacuum motors is not limited to three, and may be one, two, or four or more.

In the descriptions above, a case where the sensor unit 147 includes the sensor head board 153, the sensor support member 155, and the signal processing board 157 has been described as an example. However, the configuration of the sensor unit 147 is not limited thereto. The sensor unit 147 may include boards other than those described above, or may not include the sensor support member 155 by adopting, for example, a structure where boards are attached directly to the recess 151.

In the descriptions above, for example, the terms "vertical," "parallel," and "plane" do not have strict meanings. That is, the terms "vertical," "parallel," and "plane" allow tolerances and errors in design and manufacturing, and mean "substantially vertical," "substantially parallel," and "substantially plane."

In the descriptions above, for example, the terms "similar," "same," "equal," and "different" in an external dimension or size, a shape, a position or the like do not have strict meanings. That is, the terms "similar," "same," "equal," and "different" allow tolerances and errors in design and manufacturing, and mean "substantially similar," "substantially the same," "substantially equal," "substantially different."

According to the vacuum robot and others of the present disclosure, the generation of impurity gas may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A vacuum robot comprising:
a vacuum motor; and
an arm driven by the vacuum motor,
wherein the vacuum motor includes
a shaft that extends in an axial direction,
a bearing configured to rotatably support the shaft,
a disk disposed to be rotatable together with the shaft and having slits,
a bearing support formed of a non-magnetic material and provided with a recess that supports the bearing, the recess formed in the bearing support to be dented in the axial direction, and
a magnetic sensor disposed to face the disk in the axial direction via a thin wall of the bearing support that is formed by the recess, and
the thin wall isolates a space where the magnetic sensor is disposed under an atmospheric pressure from a space where the disk is disposed under a reduced pressure lower than the atmospheric pressure.

2. The vacuum robot according to claim 1, wherein the magnetic sensor is accommodated in the recess.

3. The vacuum robot according to claim 2, wherein the recess has an axial depth larger than a thickness of the magnetic sensor in the axial direction.

4. The vacuum robot according to claim 3, wherein the magnetic sensor includes:
a sensor head board;
a sensor support configured to support the sensor head board; and
a signal processing board configured to process a signal of the sensor head board,
the sensor head board, the sensor support, and the signal processing board are accommodated in the recess by being stacked in the axial direction, and
the recess has an axial depth larger than a thickness of the stacked sensor head board, sensor support, and signal processing board in the axial direction.

5. The vacuum robot according to claim 4, wherein the sensor support is formed of a non-magnetic material.

6. The vacuum robot according to claim 1, wherein a plurality of vacuum motors is provided, and
the plurality of vacuum motors are arranged by being stacked in the axial direction.

7. The vacuum robot according to claim 1, wherein the recess is formed in a surface of one side of the bearing support in the axial direction to be dented toward the other side of the bearing support in the axial direction, and the dent in the axial direction is formed to reach an outer surface of the bearing support in a diameter direction, thereby forming an opening in the outer surface of the bearing support in the diameter direction.

8. The vacuum robot according to claim 7, wherein the magnetic sensor includes:
a sensor head board; and
a signal processing board configured to process a signal of the sensor head board,
the signal processing board includes a connector, and
the connector is disposed in the opening to be exposed to an outside.

9. The vacuum robot according to claim 1, wherein the magnetic sensor includes:
a sensor head board: and
a sensor support configured to support the sensor head board, and the recess is thicker in axial thickness than the thin wall, and includes a mounting portion therein in which the sensor support is mounted.

10. The vacuum robot according to claim 1, wherein the bearing support includes:
a plurality of bolt holes arranged at a plurality of locations on the bearing support in a circumferential direction, and formed to penetrate the plurality of locations in the axial direction; and
a wall that covers at least a portion of an outer side of the recess in a diameter direction, and extends in the circumferential direction, and
a part of the plurality of bolt holes is formed in the wall.

11. A vacuum motor comprising:
a shaft that extends in an axial direction;
a bearing configured to rotatably support the shaft;
a disk disposed to be rotatable together with the shaft and having slits;
a bearing support formed of a non-magnetic material and provided with a recess that supports the bearing, the recess formed in the bearing support member to be dented in the axial direction; and
a magnetic sensor disposed to face the disk in the axial direction via a thin wall of the bearing support that is formed by the recess, and configured to detect the slits,
wherein the thin wall isolates a space where the magnetic sensor is disposed under an atmospheric pressure from a space where the disk is disposed under a reduced pressure lower than the atmospheric pressure.

12. An encoder for a vacuum motor including a shaft that extends in an axial direction, a bearing configured to rotatably support the shaft, and a bearing support formed of a non-magnetic material and provided with a recess that supports the bearing, the recess formed in the bearing support to be dented in the axial direction, the encoder comprising:
a disk disposed to be rotatable together with the shaft and having slits; and
a magnetic sensor disposed to face the disk in the axial direction via a thin wall of the bearing support that is formed by the recess, and configured to detect the slits,
wherein the thin wall isolates a space where the magnetic sensor is disposed under an atmospheric pressure from a space where the disk is disposed under a reduced pressure lower than the atmospheric pressure.

13. The vacuum robot according to claim 2, wherein a plurality of vacuum motors is provided, and
the plurality of vacuum motors are arranged by being stacked in the axial direction.

14. The vacuum robot according to claim 2, wherein the recess is formed in a surface of one side of the bearing support in the axial direction to be dented toward the other side of the bearing support in the axial direction, and the dent in the axial direction is formed to reach an outer surface of the bearing support in a diameter direction, thereby forming an opening in the outer surface of the bearing support in the diameter direction.

15. The vacuum robot according to claim 14, wherein the magnetic sensor includes:
a sensor head board; and
a signal processing board configured to process a signal of the sensor head board,
the signal processing board includes a connector, and
the connector is disposed in the opening to be exposed to an outside.

16. The vacuum robot according to claim 2, wherein the magnetic sensor includes:
- a sensor head board, and
- a sensor support configured to support the sensor head board, and
- the recess is thicker in axial thickness than the thin wall, and includes a mounting portion therein in which the sensor support is mounted.

17. The vacuum robot according to claim 2, wherein the bearing support includes:
- a plurality of bolt holes arranged at a plurality of locations on the bearing support in a circumferential direction, and formed to penetrate the plurality of locations in the axial direction, and
- walls that cover at least a portion of an outer side of the recess in a diameter direction, and extend in the circumferential direction, and
- a part of the plurality of bolt holes is formed in the walls.

18. A semiconductor manufacturing system, comprising:
- a transfer chamber in which a vacuum robot is disposed to transfer a semiconductor wafer under a vacuum environment; and
- a plurality of processing chambers arranged around the transfer chamber and configured to perform a preset processing on the semiconductor wafer,
wherein the vacuum robot includes a vacuum motor and an arm driven by the vacuum motor,
the vacuum motor includes:
- a shaft that extends in an axial direction;
- a bearing configured to rotatably support the shaft;
- a disk disposed to be rotatable together with the shaft and having slits;
- a bearing support formed of a non-magnetic material and provided with a recess that supports the bearing, the recess formed in the bearing support to be dented in the axial direction, and
- a magnetic sensor disposed to face the disk in the axial direction via a thin wall of the bearing support that is formed by the recess, and
the thin wall isolates a space where the magnetic sensor is disposed under an atmospheric pressure from a space where the disk is disposed under a reduced pressure lower than the atmospheric pressure.

* * * * *